United States Patent
Park et al.

(10) Patent No.: US 7,818,488 B2
(45) Date of Patent: Oct. 19, 2010

(54) MEMORY MODULE WITH REGISTERS

(75) Inventors: Kwang-Soo Park, Suwon-Si (KR);
Jeong-Hyeon Cho, Seoul (KR);
Byung-Se So, Seongnam-Si (KR);
Jung-Joon Lee, Seoul (KR); Young Yun, Yongin-Si (KR); Kwang-Seop Kim, Yongin-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1627 days.

(21) Appl. No.: 10/975,810

(22) Filed: Oct. 27, 2004

(65) Prior Publication Data

US 2005/0097264 A1    May 5, 2005

(30) Foreign Application Priority Data

Oct. 31, 2003    (KR) ................. 10-2003-0076734

(51) Int. Cl.
*G06F 12/00* (2006.01)
*G06F 12/06* (2006.01)
*G06F 13/00* (2006.01)
*G06F 13/28* (2006.01)
*G11C 8/00* (2006.01)

(52) U.S. Cl. .......................... 711/5; 711/101; 711/115; 711/172; 711/E12.001; 365/230.03

(58) Field of Classification Search ............ 711/5, 711/101, 115, 172; 365/230.03
See application file for complete search history.

(56) References Cited

U.S. PATENT DOCUMENTS

| 5,790,447 A | * | 8/1998 | Laudon et al. ............... 365/52 |
| 6,049,476 A | * | 4/2000 | Laudon et al. ............... 365/52 |
| 6,414,868 B1 | * | 7/2002 | Wong et al. ................. 365/51 |
| 6,545,895 B1 | * | 4/2003 | Li et al. ..................... 365/52 |
| 2001/0034865 A1 | * | 10/2001 | Park et al. .................. 714/724 |
| 2002/0112119 A1 | * | 8/2002 | Halbert et al. .............. 711/115 |
| 2003/0169614 A1 | * | 9/2003 | Bhakta et al. ............... 365/51 |

OTHER PUBLICATIONS

Korean Patent Application No. 10-2002-7006116 to Sun Microsystems, Inc., having Publication date of Sep. 11, 2002 (w/ English Abstract page).
Japanese Patent No. JP55028191 to NT&T Corp., having Publication date of Feb. 28, 1980 (w/ English Abstract page).
Japanese Patent No. JP2001357672 to Hitachi Ltd., having Publication date of Dec. 26, 2001 (w/ English Abstract page).

* cited by examiner

*Primary Examiner*—Mardochee Chery
*Assistant Examiner*—Michael Alsip
(74) *Attorney, Agent, or Firm*—Monica H. Choi

(57) ABSTRACT

Pairs of registers with reduced pins are disposed to overlap on front and back surfaces of a memory module. An input signal INS is transferred through the registers in series in a daisy chain fashion to avoid divergence of the input signal INS for preserved signal integrity. Each register buffers the input signal INS to memory banks disposed closely to sides of the register for reduced wiring area.

18 Claims, 6 Drawing Sheets

MEMORY MODULE WITH REGISTERS

This application claims priority to Korean Patent Application No. 2003-0076734, filed on Oct. 31, 2003, in the Korean Intellectual Property Office, the disclosure of which is incorporated herein in its entirety by reference.

BACKGROUND OF THE INVENTION

1. Field of the Invention

The present invention relates generally to memory modules, and more particularly, to a memory module having registers mounted with minimized area and with preservation of signal integrity.

2. Description of the Related Art

A memory module includes registers that receive signals from external devices and transfer such signals to memory chips mounted in the memory module. If the number of memory chips in a memory module is large, the memory module typically includes a plurality of registers.

A number of output pins of each of the registers for connecting to memory chips decreases with higher number of registers for improved signal integrity. On the other hand, a larger area is required for mounting a higher number of registers in the memory module. Also, since a memory controller must transmit signals to each of the registers, a higher number of registers increases the load of the memory controller thus limiting signal integrity.

FIG. 1 illustrates a conventional memory module with two registers. FIG. 2 is a signal connection diagram of the memory module of FIG. 1.

Referring to FIG. 1, a first register RF is mounted on a front surface RANK0 of a memory module 100, and a second register RR is mounted on a back surface RANK1 of the memory module 100. The first and second registers RF and RR are each a 1:2 register that buffers one input signal and outputs two signals equivalent to the input signal.

One 1:2 register can be substituted for two 1:1 registers thereby reducing mounting space and cost. However, the number of input/output pins of the 1:2 registers RF and RR is larger than that of a 1:1 register. Therefore, because of pins, the first and second registers RF and RR are not mounted in the same location on the front surface and the back surface RANK0 and RANK1 of the memory module 100. In other words, the first and second registers RF and RR are not mounted with any overlap between such registers RF and RR.

If a signal INS transmitted to the memory module 100 is an n-bit signal, the n-bit signal is transferred to each of the first and second registers RF and RR. The first register RF simultaneously transfers the signal INS to each of memory banks MLD0 and MLU0 disposed on the front surface RANK0 of the memory module 100 and to each of memory banks MLD1 and MLU1 disposed on the back surface RANK1 of the memory module 100.

Note that each of notations MLD0, MLU0, MLD1, and MLU1 refers to a bank (i.e., herein simply meaning a group) of at least one memory chip. In addition, the memory banks MLD0, MLU0, MLD1, and MLU1 are disposed toward the left side of the first register RF in the memory module 100.

The second register RR simultaneously transfers the signal INS to each of memory banks MRD0 and MRU0 disposed on the front surface RANK0 of the memory module 100 and to each of memory banks MRD1 and MRU1 disposed on the back surface RANK1 of the memory module 100.

Note that each of notations MRD0, MRU0, MRD1, and MRU1 refers to a bank (i.e., herein simply meaning a group) of at least one memory chip. In addition, the memory banks MRD0, MRU0, MRD1, and MRU1 are disposed toward the right side of the second register RR in the memory module 100.

The signal INS includes rank control signals (not shown), which enable ranks of the memory module 100. The rank control signals are transferred only to corresponding ranks.

The front surface RANK0 and the back surface RANK1 of the memory module 100 form a first rank and a second rank, respectively. Therefore, the rank control signal that enables the first rank of the memory module 100 is transferred to the memory banks MLD0 and MLU0 on the front surface RANK0 of the memory module 100 via the first register RF and to the memory banks MRD0 and MRU0 on the front surface RANK0 of the memory module 100 via the second register RR.

The rank control signal that enables the second rank of the memory module 100 is transferred to the memory banks MLD1 and MLU1 on the back surface RANK1 of the memory module 100 via the first register RF and to the memory banks MRD1 and MRU1 on the back surface RANK1 of the memory module 100 via the second register RR.

Because of the number of pins of the registers RF and RR, such registers RF and RR are not mounted in the same location on the front and back surfaces RANK0 and RANK1 of the memory module 100. Thus, the registers RF and RR are not mounted with overlap and are typically mounted side by side on the front and back surfaces RANK0 and RANK1 of the memory module 100, as illustrate in FIG. 1. Therefore, the area used for mounting the two 1:2 registers RF and RR is larger than the area used for mounting four 1:1 registers that may be mounted with overlap between two 1:1 registers on the front and back surfaces of the memory module.

Also, as the number of pins of the first and second registers RF and RR increases, wiring of the pins becomes more difficult, and additional space for the wiring is required. Therefore, in the memory module of FIG. 1, an advantage obtained by using the 1:2 registers is not great.

FIG. 3 illustrates a conventional memory module with four registers. FIG. 4 is a signal connection diagram of the memory module of FIG. 3.

Referring to FIGS. 3 and 4, a memory module 300 includes four 1:2 registers RF1, RR1, RF2, and RR2, each having less input/output pins than each of the first and second registers RF and RR of FIGS. 1 and 2.

Because the registers RF1, RR1, RF2, and RR2 have less input/output pins, the two registers RF1 and RR1 of a first pair are mounted back-to-back for complete overlap, and the two registers RF2 and RR2 of a second pair are mounted back-to-back for complete overlap.

In order to maintain a load of an input signal INS transferred from a controller 410 to the registers RF1, RR1, RF2, and RR2, the input signal INS is divided before being received by the registers RF1, RR1, RF2, and RR2.

For example, if the input signal INS is an n-bit signal, an m-bit signal is transferred to each of the registers RF1 and RF2 on the front surface RANK0, and an (n-m)-bit signal INS is transferred to each of the registers RR1 and RR2 on the back surface RANK1. Thus, the load of the input signal INS transferred from the controller 410 to the registers RF1, RR1, RF2, and RR2 is not increased.

The m-bit signal transferred to the register RF1 on the front surface RANK0 of the memory module 300 and the (n-m)-bit signal transferred to the register RR1 on the back surface RANK1 of the memory module 300 are simultaneously transferred to each of memory banks MLD0, MLU0, MLD1 and MLU1 that are disposed toward a left side of the registers RF1 and RR1. Therefore, each memory chip within the memory banks MLD0, MLU0, MLD1 and MLU1 receives the n-bit input signal INS.

The m-bit signal transferred to the register RF2 on the front surface RANK0 of the memory module 300 and the (n-m)-bit signal transferred to the register RR2 on the back surface RANK1 of the memory module 300 are simultaneously transferred to each of memory banks MRD0, MRU0, MRD1 and MRU1 that are disposed toward a right side of the registers RF2 and RR2. Therefore, each memory chip within the memory banks MRD0, MRU0, MRD1 and MRU1 receives the n-bit input signal INS.

The input signal INS includes rank control signals (not shown), which enable ranks of the memory module 300. The rank control signals are transferred only to corresponding ranks.

The front surface RANK0 and the back surface RANK1 of the memory module 300 form a first rank and a second rank, respectively. Therefore, the rank control signal that enables the first rank of the memory module 300 is transferred to the memory banks MLD0 and MLU0 on the front surface RANK0 of the memory module 300 via the register RF1 and to the memory banks MRD0 and MRU0 on the front surface RANK0 of the memory module 300 via the register RF2.

The rank control signal that enables the second rank of the memory module 300 is transferred to the memory banks MLD1 and MLU1 on the back surface RANK1 of the memory module 300 via the register RR1 and to the memory banks MRD1 and MRU1 on the back surface RANK1 of the memory module 300 via the register RR2.

The conventional memory modules 100 and 300 have similar signal integrity, but the memory module 300 using the four smaller registers RF1, RR1, RF2, and RR2 have smaller register-mounting area.

Nevertheless, the input signal INS transferred from the controllers 210 or 410 of the conventional memory modules 100 and 300 are diverged with a "T" shape. Unfortunately, signal integrity is diminished from impedance mismatching with such T-shaped divergence of the input signal INS.

Also, even though register mounting area of the memory module 300 is less than that of the memory module 100, space is still required for wiring the first pair of registers RF1 and RR1 to any memory bank disposed toward the left of the registers RF1 and RR1 and for wiring the second pair of registers RF2 and RR2 to any memory bank disposed toward the right of the registers.

SUMMARY OF THE INVENTION

Accordingly, registers are arranged in a memory module of the present invention with an architecture for improving signal integrity and for reducing area for register-mounting and wiring.

According to an aspect of the present invention, a memory module includes a first pair of registers with each register being disposed on a respective one of front and back surfaces of the memory module with an overlap area. The first pair is disposed between a first plurality of semiconductor banks (such as memory banks) each disposed from different sides of the first pair, and the first pair buffers data to each of the first plurality of semiconductor banks.

In an example embodiment of the present invention, the first plurality of semiconductor banks includes a left memory bank disposed from a left side of the first pair and includes a right memory bank disposed from a right side of the first pair.

In another embodiment of the present invention, the memory module is a dual in line memory module with the left and right memory banks being disposed on the front surface of the memory module. In that case, the first pair of registers is disposed also between back left and right memory banks disposed from different sides of the first pair on the back surface of the memory module, and the first pair buffers data to each of the back left and right memory banks.

In a further embodiment of the present invention, the first pair of registers is disposed at or near a center point between the left and right memory banks.

In an example embodiment of the present invention, the registers of the first pair completely overlap to be disposed back-to-back on the front and back surfaces of the memory module.

In another embodiment of the present invention, each register of the first pair inputs a single signal and outputs two signals equivalent to the single signal. The first pair of registers buffers n-bits, with one register of the first pair buffering m-bits and the other of the first pair buffering n-m bits.

In a further embodiment of the present invention, the memory module further includes a second pair of registers with each register of the second pair being disposed on a respective one of the front and back surfaces of the memory module with an overlap area. The second pair is disposed between a second plurality of semiconductor banks each disposed from different sides of the second pair, and the second pair buffers data to each of the second plurality of semiconductor banks.

In another embodiment of the present invention, an input signal is transmitted to the second pair of registers in series through the first pair of registers without diverging the input signal.

In a further embodiment of the present invention, a memory module includes a first register for buffering an input signal to at least one semiconductor bank and includes a second register for buffering the input signal to at least one semiconductor bank. The input signal is coupled to the first register that outputs a signal equivalent to the input signal to the second register, without diverging the input signal.

In this manner, pairs of registers are disposed to overlap on the front and back surfaces of the mounting module to reduce mounting area. In addition, the input signal INS is transferred through the registers in series as a daisy chain to avoid divergence of the input signal INS for preserving signal integrity.

Furthermore, because each of the registers has reduced pins, area for wiring is in turn reduced. Additionally, each of the registers buffers the input signal INS to corresponding semiconductor banks that are closely disposed to the sides of the register for further reduced wiring area. With reduced mounting area and reduced wiring area, more memory chips may be included for larger capacity of the memory module.

BRIEF DESCRIPTION OF THE DRAWINGS

The above and other features and advantages of the present invention will become more apparent when described in detail as exemplary embodiments thereof with reference to the attached drawings in which.

The figures referred to herein are drawn for clarity of illustration and are not necessarily drawn to scale.

DETAILED DESCRIPTION OF THE INVENTION

Figure 5:
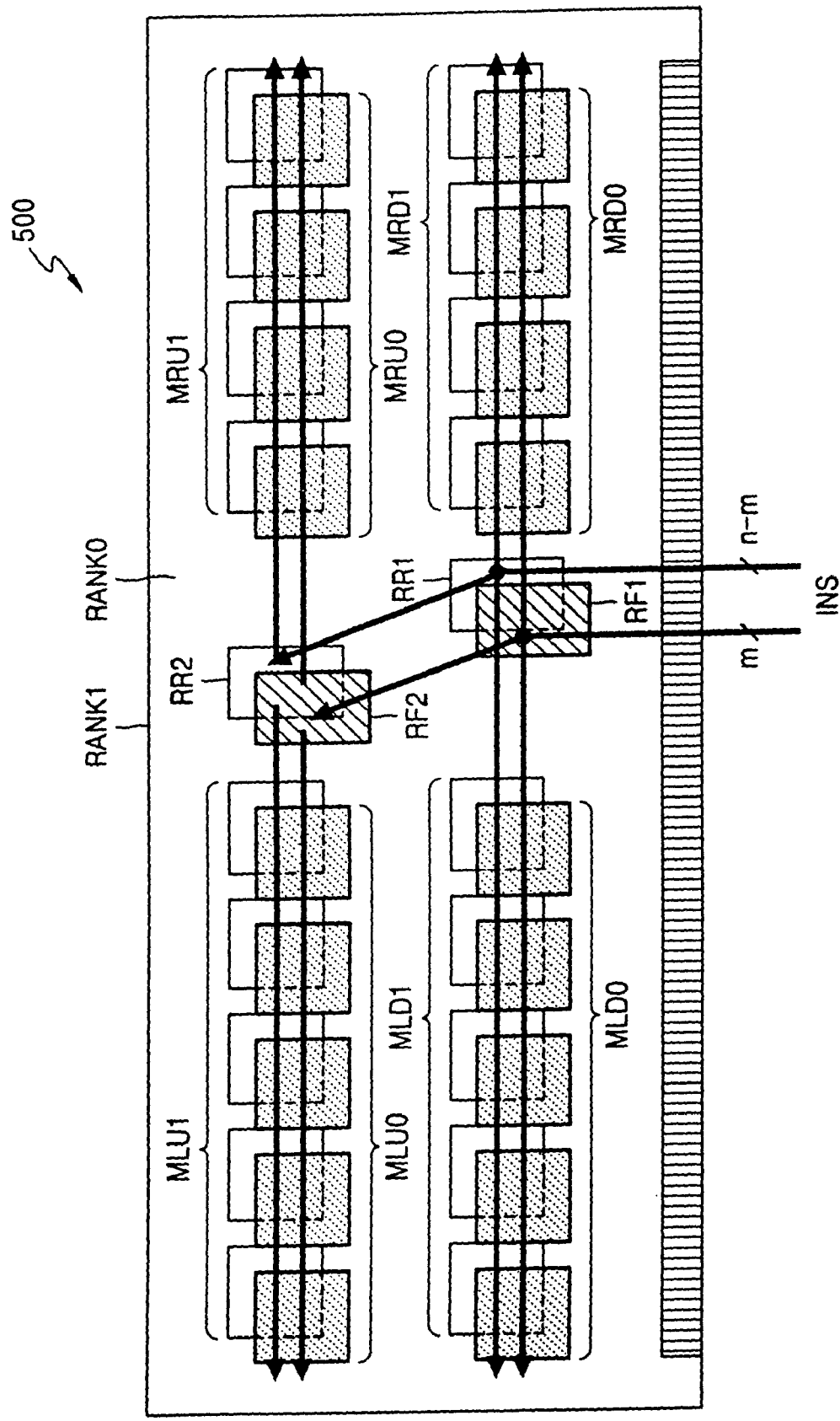
FIG. 5 illustrates a memory module with registers having an architecture according to an embodiment of the present invention.
Figure 6:
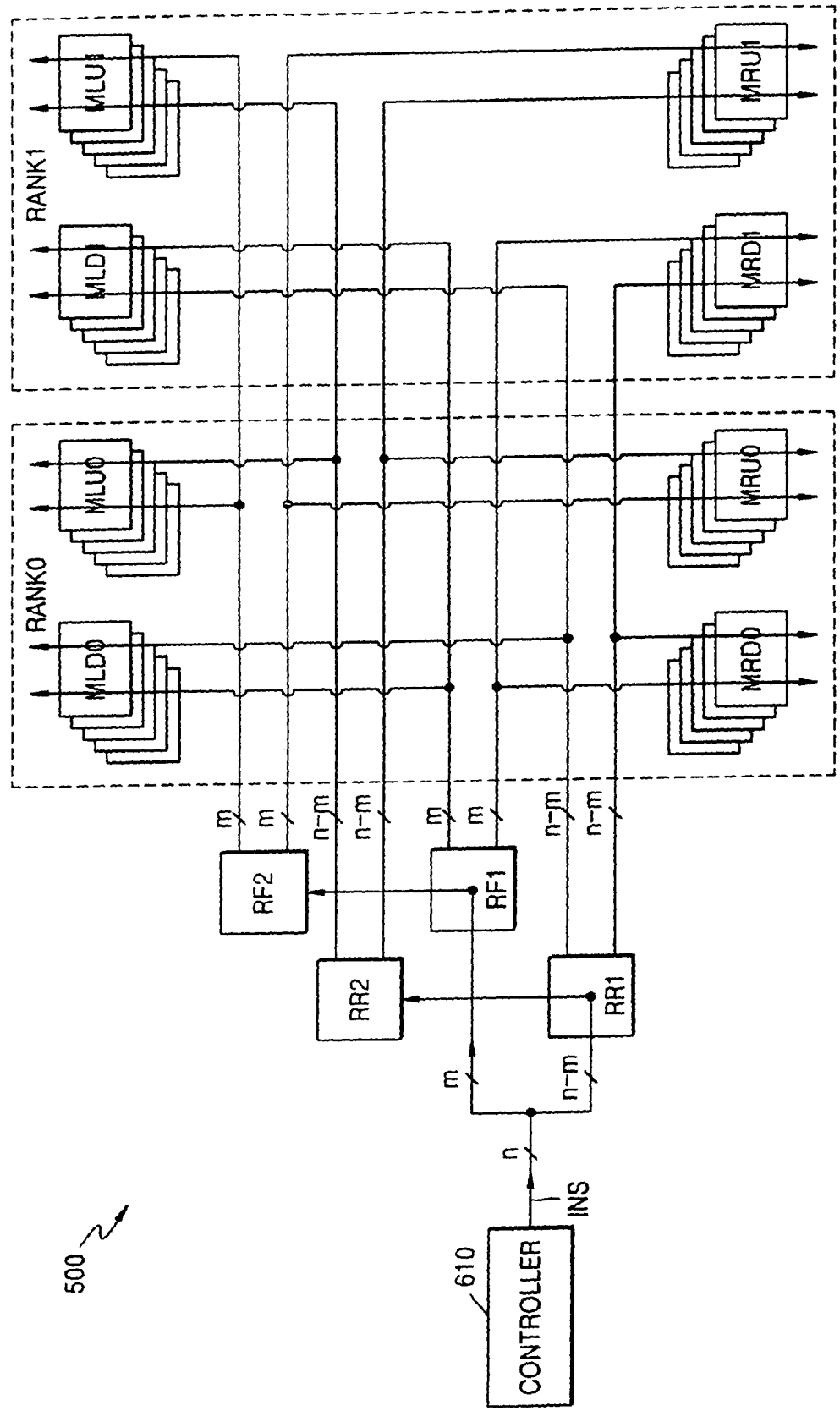
FIG. 6 is a signal connection diagram of the memory module of FIG. 5, according to an embodiment of the present invention.

FIG. 5 illustrates a memory module 500 according to an embodiment of the present invention. FIG. 6 is a signal connection diagram of the memory module of FIG. 5.

Referring to FIG. 5, a memory module 500 includes memory banks MLD0, MLU0, MRD0 and MRU0 mounted on a front surface RANK0 of the memory module 500 and includes memory banks MLD1, MLU1, MRD1 and MRU1 mounted on a back surface RANK1 of the memory module 500.

A memory bank referred to by MLD0, MLU0, MRD0, MRU0, MLD1, MLU1, MRD1 or MRU1 is defined broadly herein just as a group of at least one memory chip. The memory module 500 is a dual in line memory module (DIMM) that includes memory chips on both of the front and back surfaces RANK0 and RANK1.

The memory module 500 also includes first, second, third, and fourth registers, RF1, RF2, RR1, and RR2, respectively. The registers RF1 and RR1 comprising a first pair are mounted on the front surface RANK0 and the back surface RANK1, respectively, of the memory module 500 with an overlap area. In one embodiment of the present invention, the registers RF1 and RR1 of the first pair are mounted back-to-back on the front and back surfaces, RANK0 and RANK1, for complete overlap. However, the present invention may also be practiced with partial overlap of the registers RF1 and RR1.

In addition, the registers RF1 and RR1 of the first pair are disposed between a first plurality of memory banks. In particular, registers RF1 and RR1 are disposed between left memory banks (MLD0 and MLD1) disposed to the left of the registers RF1 and RR1 and right memory banks (MRD0 and MRD1) disposed to the right of the registers RF1 and RR1.

In one embodiment of the present invention, the registers RF1 and RR1 are disposed at or near a center point between the left memory banks (MLD0 and MLD1) and the right memory banks (MRD0 and MRD1).

Similarly, the registers RF2 and RR2 comprising a second pair are mounted on the front surface RANK0 and the back surface RANK1, respectively, of the memory module 500 with an overlap area. In one embodiment of the present invention, the registers RF2 and RR2 of the second pair are mounted back-to-back on the front and back surfaces, RANK0 and RANK1, for complete overlap. However, the present invention may also be practiced with partial overlap of the registers RF2 and RR2.

In addition, the registers RF2 and RR2 of the second pair are disposed between a second plurality of memory banks. In particular, registers RF2 and RR2 are disposed between left memory banks (MLU0 and MLU1) disposed to the left of the registers RF2 and RR2 and right memory banks (MRU0 and MRU1) disposed to the right of the registers RF2 and RR2.

In one embodiment of the present invention, the registers RF2 and RR2 are disposed at or near a center point between the left memory banks (MLU0 and MLU1) and the right memory banks (MRU0 and MRU1).

The registers RF1, RR1, RF2 and RR2 are each a 1:2 register that inputs a single signal and outputs two signals each equivalent to the single input signal. In addition, the first register RF1 transfers a portion of the input signal INS to the second register RF2, and the third register RR1 transfers a portion of the input signal INS to the fourth register RR2. Thus, the output of the first register RF1 is coupled to the input of the second register RF2, and the output of the third register RF3 is coupled to the input of the fourth register RF4.

In this manner, the input signal INS is transferred in series through the first pair of registers RF1 and RR1 to the second pair of registers RF2 and RR2. Thus, the input signal INS is transferred through a daisy chain of the first pair of registers RF1 and RR1 and the second pair of registers RF2 and RR2 such that the input signal INS is not diverged. By avoiding divergence of the input signal INS, signal integrity of the input signal INS is preserved, and ring-back phenomenon in a resistor due to impedance mismatching is prevented.

Figure 1:
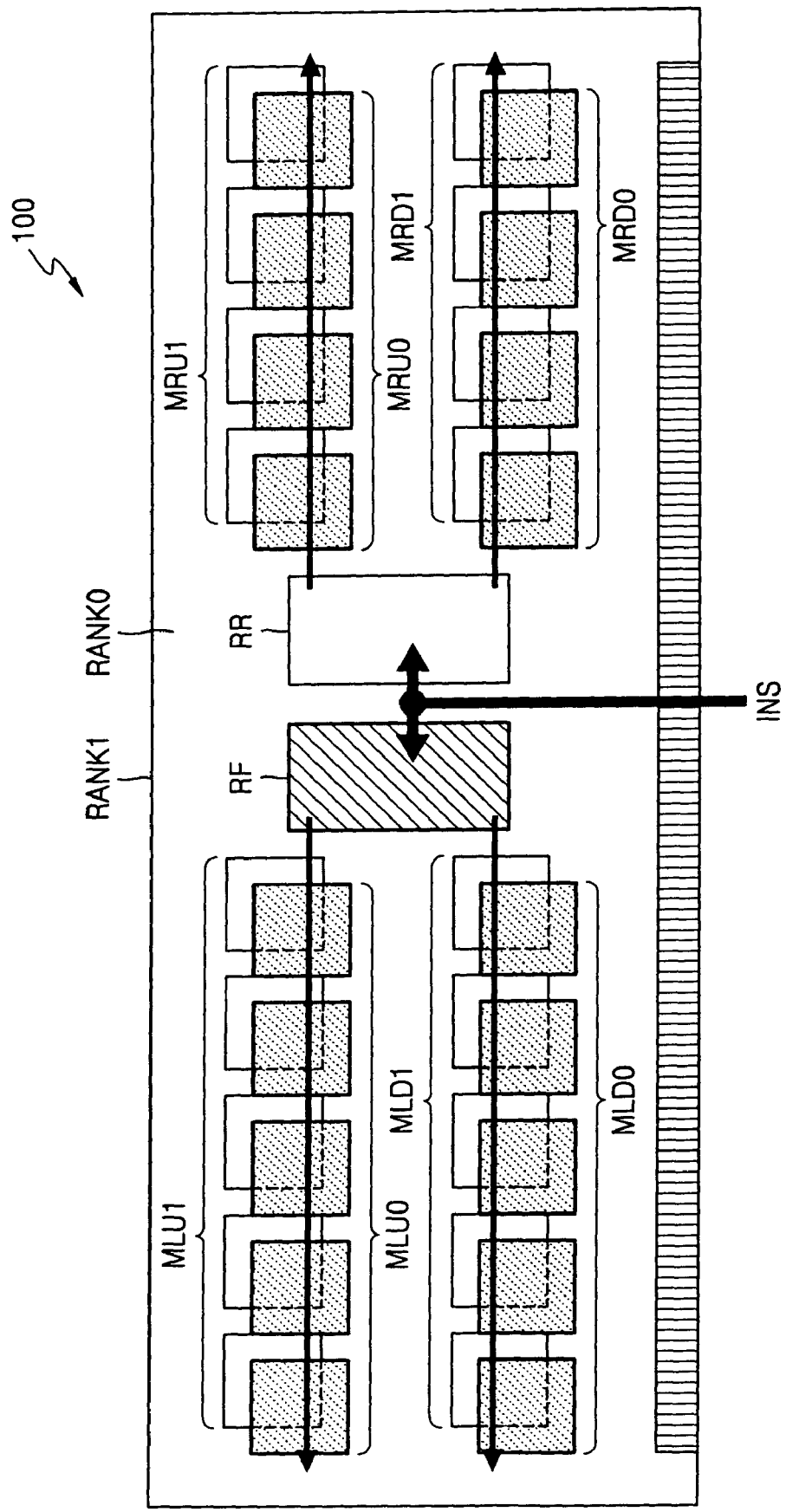
FIG. 1 illustrates a conventional memory module with two registers.
Figure 2:
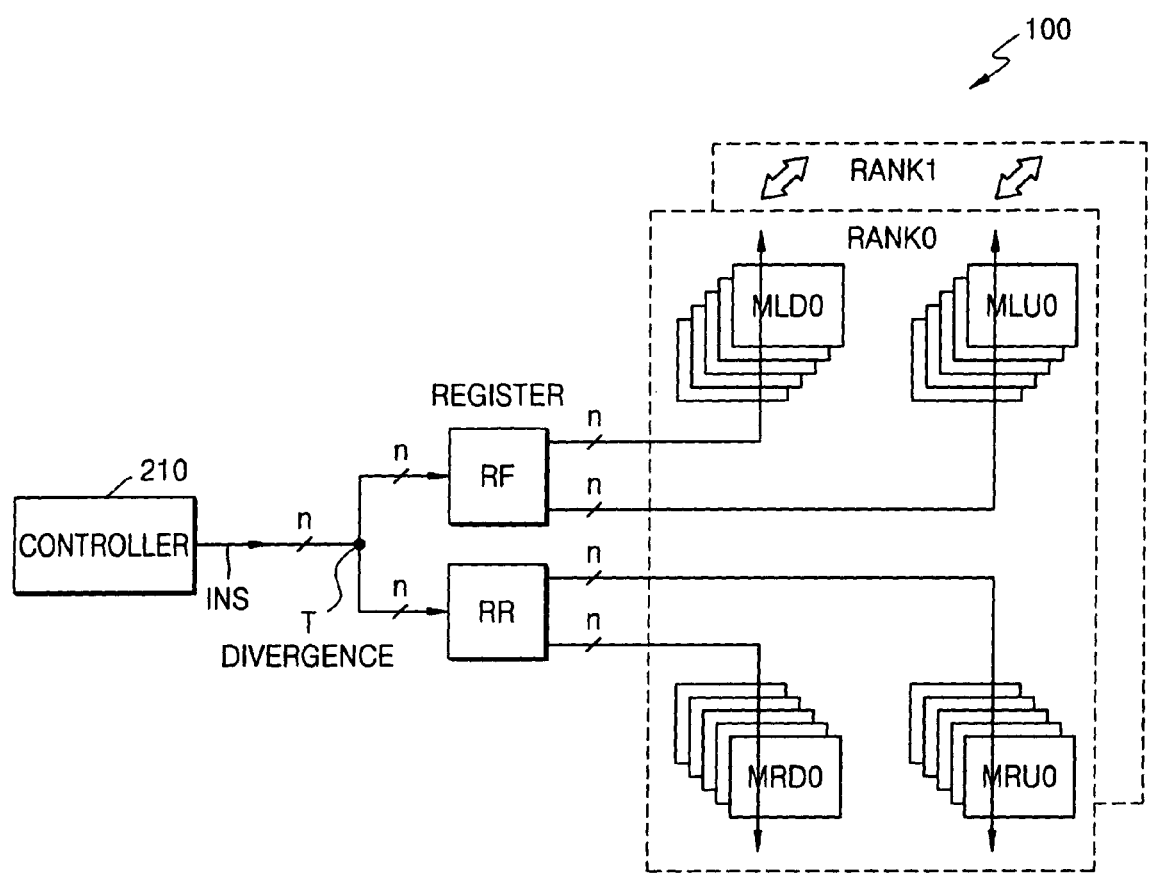
FIG. 2 is a signal connection diagram of the memory module of FIG. 1.
Figure 3:
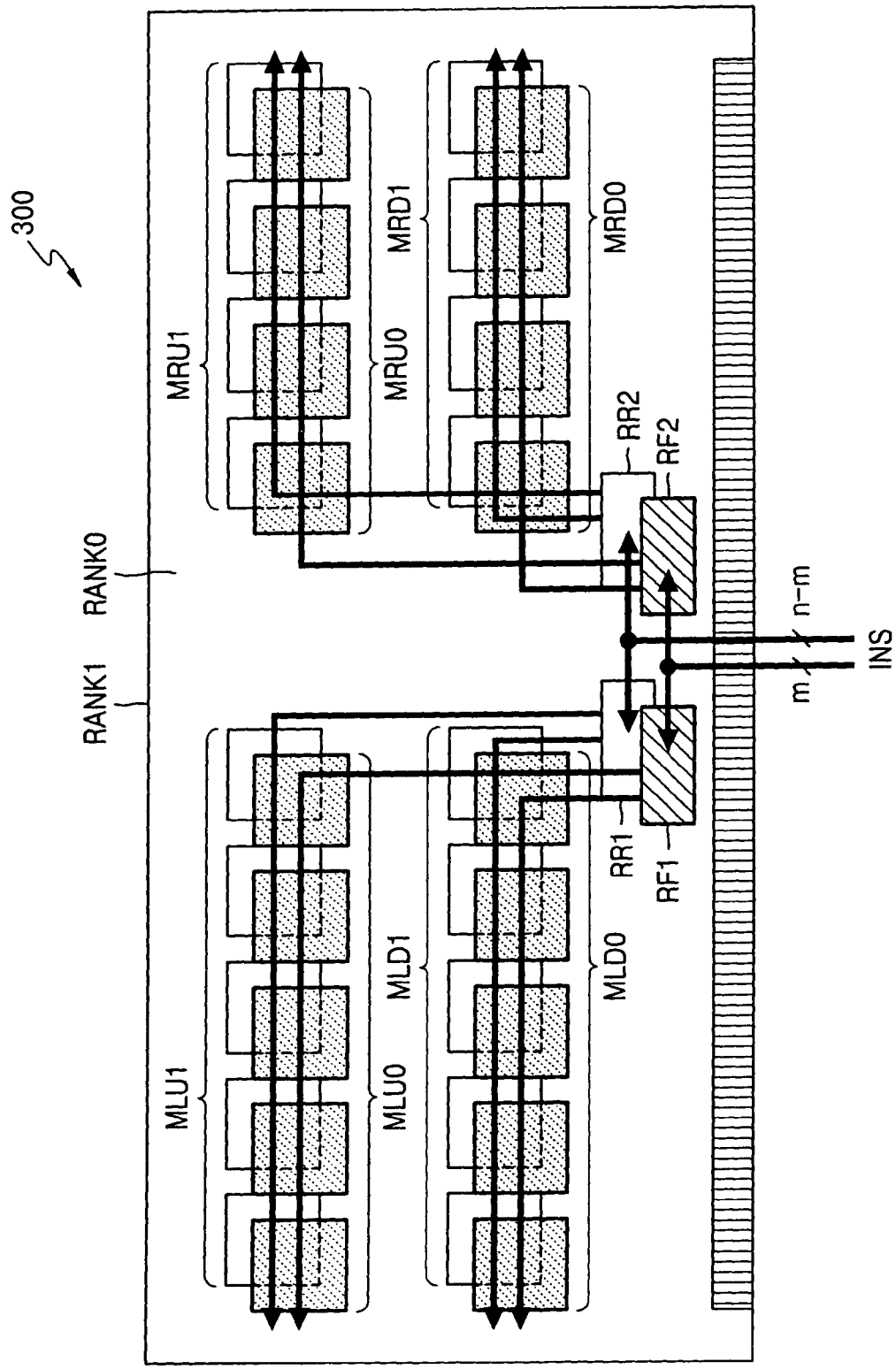
FIG. 3 illustrates a conventional memory module with four registers.
Figure 4:
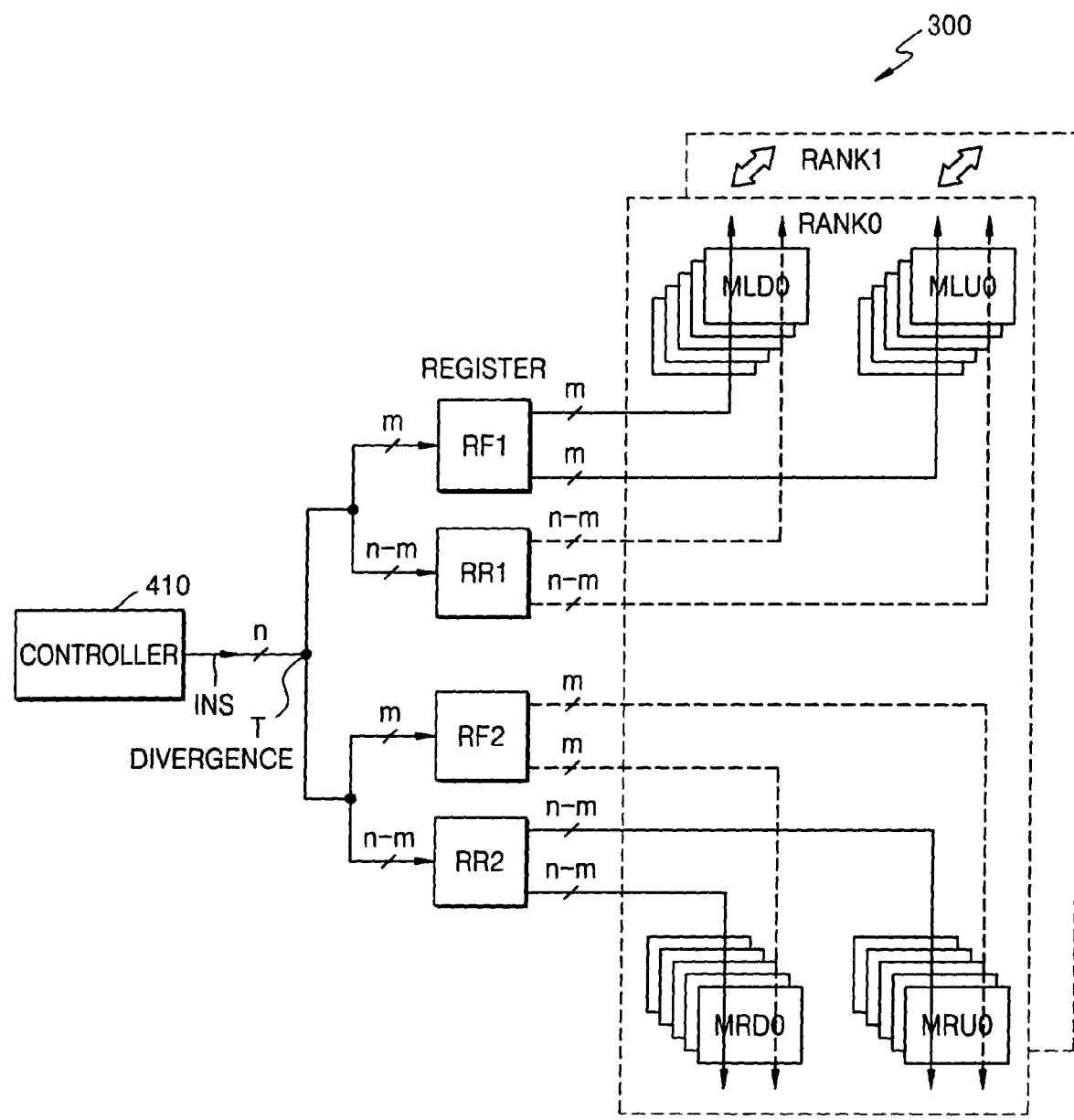
FIG. 4 is a signal connection diagram of the memory module of FIG. 3.

In contrast, in FIGS. 1, 2, 3, and 4 of the prior art, the input signal INS is diverged in a T-shape manner when the input signal INS is directly coupled to the plurality of registers (RF and RR of FIGS. 1 and 2, or RF1, RR1, RF2, and RR2 of FIGS. 3 and 4).

Referring to FIGS. 5 and 6, the registers RF1 and RR1 of the first pair, disposed between corresponding left and right memory banks MLD0, MLD1, MRD0 and MRD1, buffer and transfer data to such memory banks MLD0, MLD1 MRD0, and MRD1. Similarly, the registers RF2 and RR2 of the second pair, disposed between corresponding left and right memory banks MLU0, MLU1, MRU0, and MRU1 buffer and transfer data to such memory banks MLU0, MLU1, MRU0, and MRU1.

More specifically, the first register RF1 receives an m-bit signal and outputs two equivalent m-bit signals. One of the m-bit signals from the first register RF1 is transferred to each of MLD0 and MLD1 disposed to the left of the first register RF1 on the front and back surfaces RANK0 and RANK1 of the memory module 500. The other of the m-bit signals from the first register RF1 is transferred to each of MRD0 and MRD1 disposed to the right of the first register RF1 on the front and back surfaces RANK0 and RANK1 of the memory module 500.

In order to maintain a load of the input signal INS, if the front register RF1 receives an m-bit signal, the rear register RR1 receives an (n-m)-bit signal. Thus, the second register RR1 receives an (n-m)-bit signal and transfers two equivalent (n-m)-bit signals. One of the (n-m)-bit signals from the second register RR1 is transferred to each of the memory banks MLD0 and MLD1 disposed to the left of the second register RR1 on the front and back surfaces RANK0 and RANK1 of the memory module 500. The other of the (n-m)-bit signals from the second register RR1 is transferred to each of the memory banks MRD0 and MRD1 disposed to the right of the second register RR1 on the front and back surfaces RANK0 and RANK1 of the memory module 500.

In this manner, each of the memory banks MLD0, MRD0, MLD1 and MRD1 disposed to the sides of the first pair of registers RF1 and RR1 receives the n-bit signal from the first pair of registers RF1 and RR1.

Furthermore, on the front surface RANK0 of the module 500, the first register RF1 outputs the m-bit signal to the second register RF2. Similarly, on the back surface RANK1 of the module 500, the third register RR1 outputs the (n-m)-bit signal to the fourth register RR2.

The second register RF2 receives the m-bit signal from the first register RF1 and outputs two equivalent m-bit signals. One of the m-bit signals from the second register RF2 is transferred to each of MLU0 and MLU1 disposed to the left of the second register RF2 on the front and back surfaces RANK0 and RANK1 of the memory module 500. The other of the m-bit signals from the second register RF2 is transferred to each of MRU0 and MRU1 disposed to the right of the second register RF2 on the front and back surfaces RANK0 and RANK1 of the memory module 500.

The fourth register RR2 receives the (n-m)-bit signal from the third register RR1 and transfers two equivalent (n-m)-bit signals. One of the (n-m)-bit signals from the fourth register RR2 is transferred to each of the memory banks MLU0 and MLU1 disposed to the left of the fourth register RR1 on the front and back surfaces RANK0 and RANK1 of the memory module 500. The other of the (n-m)-bit signals from the fourth register RR2 is transferred to each of the memory banks MRU0 and MRU1 disposed to the right of the fourth register RR2 on the front and back surfaces RANK0 and RANK1 of the memory module 500.

In this manner, each of the memory banks MLU0, MRU0, MLU1 and MRU1 disposed to the sides of the second pair of registers RF2 and RR2 receives the n-bit signal from the second pair of registers RF2 and RR2.

The input signal INS also includes rank control signals (not shown), which enable ranks of the memory module 500. The rank control signals are transferred only to corresponding ranks.

The front surface RANK0 and the back surface RANK1 of the memory module 500 form a first rank and a second rank, respectively. Therefore, the rank control signal that enables the first rank of the memory module 500 is transmitted through the first register RF1 and the second register RF2 in series without being diverged.

The rank control signal received by the first register RF1 is transmitted to the left and right memory banks MLD0 and MRD0 on the front surface RANK0 of the memory module 500. Similarly, the rank control signal received by the second register RF2 is transmitted to the left and right memory banks MLU0 and MRU0 on the front surface RANK0 of the memory module 500.

The rank control signal that enables the second rank of the memory module 500 is transmitted through the third register RR1 and the fourth register RR2 in series without being diverged. The rank control signal received by the third register RR1 is transmitted to the left and right memory banks MLD1 and MRD1 on the back surface RANK1 of the memory module 500. Similarly, the rank control signal received by the fourth register RR2 is transmitted to the left and right memory banks MLU1 and MRU1 on the back surface RANK1 of the memory module 500.

In this manner, the mounting area for the registers RF1, RR1, RF2, and RR2 is reduced because the registers RF1 and RR1 of the first pair and the registers RF2 and RR2 of the second pair are each disposed to overlap back-to-back on the front and back surfaces RANK0 and RANK1 of the mounting module 500. In addition, signal integrity is preserved by transferring the input signal INS in series as a daisy chain to avoid divergence of the input signal INS.

Furthermore, because each of the registers RF1, RR1, RF2, and RR2 has reduced pins, area for wiring is also reduced. Additionally, each of the first pair of registers RF1 and RR1 and the second pair of registers RF2 and RR2 buffers the input signal INS to corresponding memory banks that are closely disposed to the sides of each of such pairs for further reduced wiring area. With the reduced area for wiring and for mounting of the registers, more memory chips may be included for larger capacity of the memory module 500.

The foregoing is by way of example only and is not intended to be limiting. For example, the present invention herein is described for a memory module with banks of memory chips. However, the present invention may be generalized to registers for buffering the input signal INS to any other types of semiconductor chips. In addition, the term "memory bank" is broadly used herein to just refer to a group of at least one memory chip, and the term "semiconductor bank" is broadly used herein to just refer to a group of at least one semiconductor chip. Furthermore, any numbers described or illustrated herein are by way of example only. Thus, the present invention may be practiced with any number of pairs of front and back registers with any number of memory banks. The present invention is limited only as defined in the following claims and equivalents thereof.

What is claimed is:

1. A memory module comprising:
   a first pair of registers with each register being disposed on a respective one of front and back surfaces of the memory module with an overlap area between the registers of the first pair;
   wherein first semiconductor banks are disposed from opposite directions of a first register of said first pair on said front surface of the memory module, and wherein second semiconductor banks are disposed from opposite directions of a second register of said first pair on said back surface of the memory module;
   and wherein each of said first and second registers receives a respective single signal and transmits respective two signals equivalent to the respective single signal to said first and second semiconductor banks disposed from said opposite directions of said each register on the front or back surfaces of the memory module such that said respective two signals from said each register are transmitted in opposite directions; and
   a second pair of registers each receiving an input signal transmitted in series through a register of the first pair without a T-shaped divergence of the input signal.

2. The memory module of claim 1, wherein the first semiconductor banks include:
   a left memory bank disposed from a left side of the first pair; and
   a right memory bank disposed from a right side of the first pair.

3. The memory module of claim 2,
   wherein the memory module is a dual in line memory module with the left and right memory banks being disposed on the front surface of the memory module,
   and wherein the first pair of registers is disposed also between back left and right memory banks disposed from different sides of the first pair on the back surface of the memory module;
   and wherein the first pair buffers data to each of the back left and right memory banks.

4. The memory module of claim 2, wherein the first pair of registers is disposed at or near a center point between the left and right semiconductor banks.

5. The memory module of claim 1, wherein the first pair of registers completely overlap to be disposed back-to-back on the front and back surfaces of the memory module.

6. The memory module of claim 1, wherein the first pair of registers buffers n-bits, with one register of the first pair buffering m-bits and the other of the first pair buffering n-m bits.

7. The memory module of claim 1, wherein each register of the second pair is disposed on a respective one of the front and back surfaces of the memory module with an overlap area between the registers of the second pair;
   and wherein the second pair is disposed between respective semiconductor banks each disposed from different directions of the second pair;
   and wherein the second pair buffers data to each of the respective semiconductor banks.

8. The memory module of claim 7, wherein the respective semiconductor banks includes:
a left memory bank disposed from a left side of the second pair; and
a right memory bank disposed from a right side of the second pair.

9. The memory module of claim 8,
wherein the memory module is a dual in line memory module with the left and right memory banks being disposed on the front surface of the memory module,
and wherein the second pair of registers is disposed also between back left and right memory banks disposed from different sides of the second pair on the back surface of the memory module;
and wherein the second pair buffers data to each of the back left and right memory banks.

10. The memory module of claim 8, wherein the second pair of registers is disposed at or near a center point between the left and right memory banks.

11. The memory module of claim 7, wherein the second pair of registers completely overlap to be disposed back-to-back on the front and back surfaces of the memory module.

12. The memory module of claim 7, wherein each register of the second pair inputs a single signal and outputs two signals equivalent to the single signal to said semiconductor banks diposed from said different directions of the second pair.

13. The memory module of claim 7, wherein the second pair of registers buffers n-bits, with one register of the second pair buffering m-bits and the other of the second pair buffering n-m bits.

14. A memory module comprising:
a first register for buffering an input signal to first semiconductor banks; and
a second register for buffering the input signal to second semiconductor banks,
wherein the input signal is coupled to the first register that outputs a signal equivalent to the input signal to the second register, without a T-shaped divergence of the input signal,
and wherein the first register receives said input signal and transmits two respective signals equivalent to the input signal to said first semiconductor banks disposed from opposite directions of the first register on front or back surfaces of the memory module such that said two respective signals from the first register are transmitted in opposite directions;
and wherein the second register receives said input signal and transmits two respective signals equivalent to the input signal to said second semiconductor banks disposed from opposite directions of the second register on the front or back surfaces of the memory module such that said two respective signals from the second register are transmitted in opposite directions.

15. The memory module of claim 14, further comprising:
a first pair of registers including the first register disposed on said front surface of the memory module and with another register of the first pair being disposed on said back surface of the memory module; and
a second pair of registers including the second register disposed on the front surface of the memory module and with another register of the second pair being disposed on the back surface of the memory module;
wherein the input signal is coupled to the first pair of registers that outputs a signal equivalent to the input signal to the second pair of registers, without diverging the input signal.

16. The memory module of claim 15, wherein the first pair of registers completely overlap to be disposed back-to-back on the front and back surfaces of the memory module, and wherein the second pair of registers completely overlap to be disposed back-to-back on the front and back surfaces of the memory module.

17. The memory module of claim 14, wherein the memory module is a dual in line memory module such that the first and second registers buffer data to said semiconductor banks disposed on said front and back surfaces of the memory module.

18. The memory module of claim 14, wherein the first register buffers the input signal to memory banks disposed to left and right sides of the first register, and wherein the second register buffers the input signal to memory banks disposed to left and right sides of the second register.

* * * * *